(12) United States Patent
Xu

(10) Patent No.: US 10,263,201 B2
(45) Date of Patent: Apr. 16, 2019

(54) FLEXIBLE DISPLAY PANEL ATTACHING DEVICE AND ATTACHING METHOD OF FLEXIBLE DISPLAY PANEL

(71) Applicant: WUHAN CHINA STAR OPTOELECTRONICS TECHNOLOGY CO., LTD., Wuhan, Hubei (CN)

(72) Inventor: Huan Xu, Hubei (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/564,111

(22) PCT Filed: May 18, 2017

(86) PCT No.: PCT/CN2017/084853
§ 371 (c)(1),
(2) Date: Oct. 3, 2017

(87) PCT Pub. No.: WO2018/192045
PCT Pub. Date: Oct. 25, 2018

(65) Prior Publication Data
US 2018/0301643 A1    Oct. 18, 2018

(30) Foreign Application Priority Data
Apr. 18, 2017    (CN) .......................... 2017 1 0252811

(51) Int. Cl.
*H05K 5/00* (2006.01)
*H01L 51/00* (2006.01)
*H01L 51/56* (2006.01)
*G06F 1/16* (2006.01)
*H01L 51/52* (2006.01)

(52) U.S. Cl.
CPC ........ *H01L 51/0097* (2013.01); *G06F 1/1652* (2013.01); *H01L 51/524* (2013.01); *H01L 51/56* (2013.01); *H01L 2251/5338* (2013.01)

(58) Field of Classification Search
CPC .................................................. H01L 21/6835
USPC .................................................... 361/679.01
See application file for complete search history.

(56) References Cited

U.S. PATENT DOCUMENTS

| 2012/0218503 A1* | 8/2012 | Tsai | ...................... B32B 43/006 349/153 |
| 2016/0225653 A1* | 8/2016 | Marrs | ................. H01L 21/6835 |

* cited by examiner

*Primary Examiner* — Jerry Wu
(74) *Attorney, Agent, or Firm* — Ladas & Parry LLP

(57) ABSTRACT

A flexible display panel attaching device is provided, and includes: a profile modeling fixture, a first sucking-attachment platform, a second sucking-attachment platform, a first pressing clamp assembly, a second pressing clamp assembly, a roller, a first air blow gun, and a second air blow gun. A portion of a flexible display layer is attached to a main body portion of a cover glass by a roll-pressing of the roller, and then two regions of the flexible display layer which the roller cannot reach are blown by using two air blow guns, so that the two regions of the flexible display layer are attached to two bending portions of the cover glass.

15 Claims, 3 Drawing Sheets

FLEXIBLE DISPLAY PANEL ATTACHING DEVICE AND ATTACHING METHOD OF FLEXIBLE DISPLAY PANEL

FIELD OF THE INVENTION

The present disclosure relates to a manufacturing field of display panels, and more particularly to a flexible display panel attaching device.

BACKGROUND OF THE INVENTION

A flexible organic light-emitting diode (OLED) display will be a new trend in the future of the display field. The flexible feature of the flexible OLED is continuously being developed and used. For example, a flexible OLED can be attached to a curved glass cover to achieve a front display and an edge display of a product.

With a wide development and application of the flexible OLED in the panel display field, a display with arc-shaped edges is being continuously developed, wherein a fillet of an edge of the display product is becoming smaller and smaller, and the radian thereof is becoming greater and greater, so that an attachment between a flexible OLED layer and a 3D cover glass is more difficult than before.

As mentioned above, because the fillet of the edge of the OLED display product is becoming smaller and smaller, and the radian thereof is becoming greater and greater, it is necessary to provide a new flexible display panel attaching device.

SUMMARY OF THE INVENTION

The present disclosure provides a flexible display panel attaching device, which can attach a flexible OLED display layer to a cover glass with a greater radian and a smaller fillets edge, so as to solve the problem: a conventional cover glass has a smaller fillet of an edge, and a greater radian, so that an attachment between the flexible layer and the cover glass is more difficult than before.

To solve the above-mentioned problems, the present disclosure provides technical solutions as follows:

The present disclosure provides a flexible display panel attaching device, which comprises:
 a profile modeling fixture configured to clamp a cover glass, wherein the cover glass includes a main body portion and two bending portions on two ends of the main body portion;
 a sucking-attachment assembly located directly under the profile modeling fixture and configured to suck and attach a flexible film substrate, wherein a flexible display layer is adhered on a surface of the flexible film substrate, the sucking-attachment assembly includes a first sucking-attachment platform and a second sucking-attachment platform disposed symmetrically to each other; there is a distance between the first sucking-attachment platform and the second sucking-attachment platform; one end of the flexible film substrate is sucked onto the first sucking-attachment platform, and an opposite end of the flexible film substrate is sucked onto the second sucking-attachment platform; and a width of the flexible film substrate is greater than that of the flexible display layer, so that two regions of the flexible film substrate exceeding the flexible display layer are formed as two sucking-attachment regions;
 a roller assembly having at least one roller connected to a horizontal moving device and a vertical moving device, wherein the roller is located between the first sucking-attachment platform and the second sucking-attachment platform, and under the flexible film substrate; the roller is configured to lift the flexible film substrate and the flexible display layer, and then to roll and press the flexible film substrate and the flexible display layer, so as to attach a portion of the flexible display layer on a surface of the main body portion of the cover glass; and
 an air blow gun assembly located between the first sucking-attachment platform and the second sucking-attachment platform, and under the flexible film substrate, wherein the air blow gun assembly includes a first air blow gun and a second air blow gun disposed symmetrically to each other; and the first air blow gun and the second air blow gun are configured to eject two high pressure air flows to two ends of the flexible display layer, so as to attach the two ends of the flexible display layer to a surface of the two bending portions of the cover glass.

According to a preferable embodiment of the present disclosure, a pressing mechanism is disposed outside of the sucking-attachment assembly, and includes a first pressing clamp assembly and a second pressing clamp assembly; the first pressing clamp assembly is disposed outside of the first sucking-attachment platform; and the second pressing clamp assembly is disposed outside of the second sucking-attachment platform.

According to a preferable embodiment of the present disclosure, the first pressing clamp assembly has a supporting portion, and a moving track is movably connected to a bottom of the supporting portion; a vertical track is disposed at one end of the supporting portion; and a pressing clamp is movably connected to the vertical track.

According to a preferable embodiment of the present disclosure, the air blow gun assembly further includes a first rotating mechanism and a second rotating mechanism; and the first rotating mechanism corresponds and connects to the first air blow gun, and the second rotating mechanism corresponds and connects to the second air blow gun.

According to a preferable embodiment of the present disclosure, the first rotating mechanism has a base, and two ends of the base are provided with two supporting boards; the first air blow gun is pivotally connected between the two supporting boards by a shaft; and one end of the shaft is connected to a servomotor.

According to a preferable embodiment of the present disclosure, the flexible display panel attaching device is disposed in a vacuum chamber.

The present disclosure further provides a flexible display panel attaching device, which comprises:
 a profile modeling fixture configured to clamp a cover glass, wherein the cover glass includes a main body portion and two bending portions on two ends of the main body portion;
 a sucking-attachment assembly located directly under the profile modeling fixture and configured to suck and attach a flexible film substrate, wherein a flexible display layer is adhered on a surface of the flexible film substrate, the sucking-attachment assembly includes a first sucking-attachment platform and a second sucking-attachment platform disposed symmetrically to each other; there is a distance between the first sucking-attachment platform and the second sucking-attachment platform; and one end of the flexible film substrate is sucked onto the first sucking-attachment platform, and an opposite end of the flexible film substrate is sucked onto the second sucking-attachment platform;

a roller assembly having at least one roller connected to a horizontal moving device and a vertical moving device, wherein the roller is located between the first sucking-attachment platform and the second sucking-attachment platform, and under the flexible film substrate; the roller is configured to lift the flexible film substrate and the flexible display layer, and then to roll and press the flexible film substrate and the flexible display layer, so as to attach a portion of the flexible display layer onto a surface of the main body portion of the cover glass; and an air blow gun assembly located between the first sucking-attachment platform and the second sucking-attachment platform, and under the flexible film substrate, wherein the air blow gun assembly includes a first air blow gun and a second air blow gun disposed symmetrically to each other; and the first air blow gun and the second air blow gun are configured to eject two high pressure air flows to two ends of the flexible display layer, so as to attach the two ends of the flexible display layer to a surface of the two bending portions of the cover glass.

According to a preferable embodiment of the present disclosure, a pressing mechanism is disposed outside of the sucking-attachment assembly, and includes a first pressing clamp assembly and a second pressing clamp assembly; the first pressing clamp assembly is disposed outside of the first sucking-attachment platform; and the second pressing clamp assembly is disposed outside of the second sucking-attachment platform.

According to a preferable embodiment of the present disclosure, the first pressing clamp assembly has a supporting portion, and a moving track is movably connected to a bottom of the supporting portion; a vertical track is disposed at one end of the supporting portion; and a pressing clamp is movably connected to the vertical track.

According to a preferable embodiment of the present disclosure, the air blow gun assembly further includes a first rotating mechanism and a second rotating mechanism; and the first rotating mechanism corresponds and connects to the first air blow gun, and the second rotating mechanism corresponds and connects to the second air blow gun.

According to a preferable embodiment of the present disclosure, the first rotating mechanism has a base, and two ends of the base are provided with two supporting boards; the first air blow gun is pivotally connected between the two supporting boards by a shaft; and one end of the shaft is connected to a servomotor.

According to a preferable embodiment of the present disclosure, the flexible display panel attaching device is disposed in a vacuum chamber.

The present disclosure further provides an attaching method of a flexible display panel, which uses the above-mentioned flexible display panel attaching device, and comprises steps of:

providing a cover glass, and attaching the cover glass to the profile modeling fixture;

providing a flexible film substrate, and adhering a flexible display layer to the flexible film substrate;

sucking and attaching two ends of the flexible film substrate onto the first sucking-attachment platform and the second sucking-attachment platform;

using the roller to lift the flexible film substrate and the flexible display layer, and rolling and pressing the flexible film substrate and the flexible display layer, so as to attach a portion of the flexible display layer onto a surface of a main body portion of the cover glass;

using the first air blow gun to eject a high pressure air flow to the one end of the flexible display layer, and using the second air blow gun to eject another high pressure air flow to the opposite end of the flexible display layer, so as to attach two ends of the flexible display layer to a surface of two bending portions of the cover glass; and removing the flexible film substrate to finish the attachment.

According to a preferable embodiment of the present disclosure, after the step of sucking and attaching two ends of the flexible film substrate onto the first sucking-attachment platform and the second sucking-attachment platform, the attaching method further includes steps of: by using a first pressing clamp, one end of the flexible film substrate is fixed, and by using a second pressing clamp, an opposite end of the flexible film substrate is fixed.

According to a preferable embodiment of the present disclosure, the step of "using the first air blow gun to eject a high pressure air flow to the one end of the flexible display layer and using the second air blow gun to eject another high pressure air flow to the opposite end of the flexible display layer" further includes steps of: the first air blow gun is rotated back and forth to eject a high pressure air flow onto the one end of the flexible display layer, and the second air blow gun is rotated back and forth to eject another high pressure air flow onto the opposite end of the flexible display layer.

The advantageous effects of the present disclosure are: by the flexible display panel attaching device of the present disclosure, a flexible OLED display layer can be attached to a surface of the cover glass with a greater radian and smaller fillets, so as to increase the quality of the attachment of the flexible OLED display layer.

DESCRIPTION OF THE DRAWINGS

In order to more clearly illustrate technical solutions of the embodiments or in the prior art, accompany drawings which need to be used in the description of the embodiments or the prior art will be simply introduced. Obviously, the accompany drawings in the following description are merely some embodiments, and for those of ordinary skill in the art, other embodiments can further be obtained according to these accompany drawings without contributing any creative work.

DETAILED DESCRIPTION OF THE PREFERRED EMBODIMENTS

Figure 1:
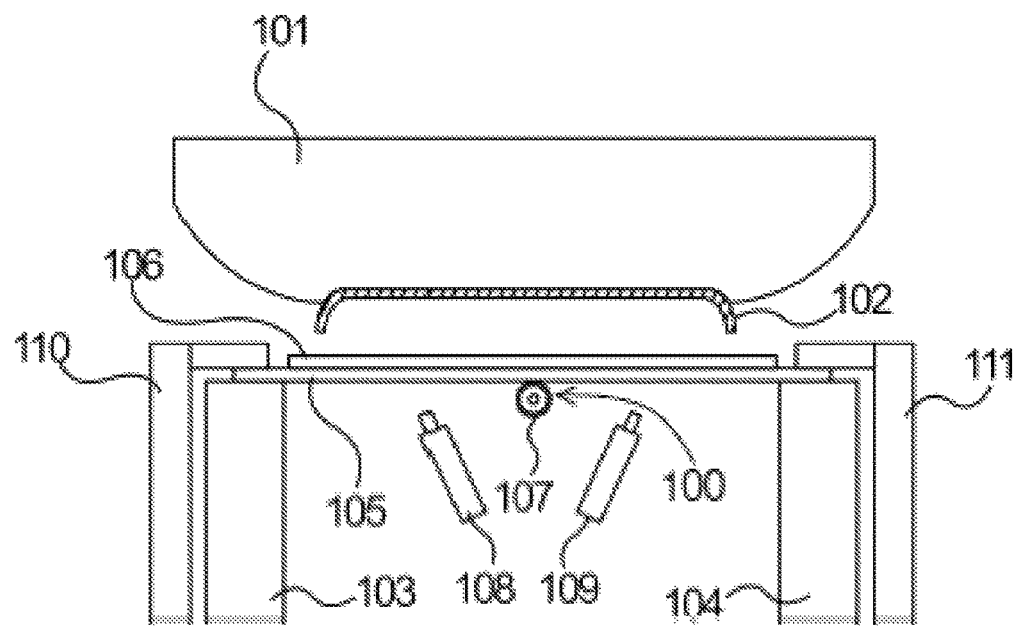
FIG. 1 is a schematic structural view of a flexible display panel attaching device according to the present disclosure.

The foregoing objects, features, and advantages adopted by the present disclosure can be best understood by referring to the following detailed description of the preferred embodiments and the accompanying drawings. Furthermore, the directional terms described in the present disclosure, such as upper, lower, front, rear, left, right, inside, outer, side, etc., are only directions with reference to the accompanying drawings, so that the used directional terms are used to describe and understand the present disclosure, but the present disclosure is not limited thereto. In the drawings, units with similar structures use the same numerals.

The present disclosure can solve the technical problems of the prior art: a fillet of an edge of a conventional flexible organic light-emitting diode (OLED) display product is becoming smaller and smaller, and the radian thereof is becoming greater and greater, so that a manufacturing process of the display product is more difficult than before. This embodiment can solve the defect.

Refer now to FIG. 1, which is a flexible display panel attaching device according to the present disclosure, and the device includes: a profile modeling fixture 101, a sucking-attachment assembly, a roller assembly 100, and an air blow gun assembly.

A top portion of the profile modeling fixture 101 is provided with a lifting mechanism, and the lifting mechanism can be a lifting air cylinder. A bottom portion of the profile modeling fixture 101 has a recess, the shape and the size of which are similar to that of a cover glass 102. An inside of the recess has a retractable clamping board. One end of the cover glass 102 is put into the recess, and is clamped by the clamping board. The cover glass 102 includes a main body portion and two bending portions on two ends of the main body portion, wherein the main body portion can be a plane or a curved surface, and can combine with the bending portions to form a 3D cover glass 102.

The sucking-attachment assembly is located directly under the profile modeling fixture 101, and includes a first sucking-attachment platform 103 and a second sucking-attachment platform 104 disposed symmetrically to each other, wherein the first sucking-attachment platform 103 or the second sucking-attachment platform 104 has a vacuum device and suckers located on the vacuum device, which are configured to suck and attach a flexible film substrate 105.

A surface of the flexible film substrate 105 is proved with a glue layer configured to adhere a flexible display layer 106, and the width of the flexible display layer 106 is narrower than that of the flexible film substrate 105, so that the two ends of the flexible film substrate 105 retain two sucking-attachment regions, and at the same time, the sucking-attachment regions are convenient for removing the flexible film substrate 105 after finishing an attachment between the flexible display layer 106 and the cover glass 102.

There is a distance between the first sucking-attachment platform 103 and the second sucking-attachment platform 104, and the distance is smaller than that of the flexible film substrate 105; and the sucking-attachment region of one end of the flexible film substrate 105 is sucked onto the first sucking-attachment platform 103, and the sucking-attachment region of an opposite end of the flexible film substrate 105 is sucked onto the second sucking-attachment platform 104.

The roller assembly 100 includes at least one roller 107, and a center axle of the roller 107 is used to be a rotating axle. A moving mechanism is disposed at one end of the rotating axle, and the moving mechanism includes a vertical moving device and a horizontal moving device. For example, the vertical moving device has a vertical sliding rail and a vertical driving electric machinery movably disposed on the vertical sliding rail; and the horizontal moving device has a horizontal sliding rail and a horizontal driving electric machinery movably disposed on the horizontal sliding rail, wherein the vertical sliding rail is fixed and connected to the horizontal driving electric machinery, and one end of the rotating axle is fixed and connected to the vertical driving electric machinery.

The roller 107 is located between the first sucking-attachment platform 103 and the second sucking-attachment platform 104, and under the flexible film substrate 105.

The vertical driving electric machinery can be vertically moved on the vertical sliding rail, so as to vertically move the roller 107 up and down, so that a portion of the flexible film substrate 105 and the flexible display layer 106 which are contacted with the roller 107 are close to the cover glass 102.

The horizontal driving electric machinery can be horizontally moved on the horizontal sliding rail, so as to horizontally move the vertical moving device, so that the roller 107 rolls and presses the flexible film substrate 105 and the flexible display layer 106 to attach to the main body portion of the cover glass 102.

The air blow gun assembly is located between the first sucking-attachment platform 103 and the second sucking-attachment platform 104, and under the flexible film substrate 105. The air blow gun assembly includes a first air blow gun 108 and a second air blow gun 109 disposed symmetrically to each other. The first air blow gun 108 and the second air blow gun 109 are configured to eject a high pressure air flow to the two ends of the flexible display layer 106, so as to attach the two ends of the flexible display layer 106 to a surface of the two bending portions of the cover glass 102.

The air blow gun assembly further includes a first rotating mechanism and a second rotating mechanism, wherein the first rotating mechanism corresponds and connects to the first air blow gun 108, and the second rotating mechanism corresponds and connects to the second air blow gun 109.

The first rotating mechanism has a base, and two ends of the base are provided with two supporting boards. The first air blow gun 108 is pivotally connected between the two supporting boards by a shaft, and one end of the shaft is connected to a servomotor.

The first rotating mechanism is configured to swing the first air blow gun 108 blowing to one end of the flexible display layer 106, so that the end portion of the flexible display layer 106 is driven by the air flow, so as to attach forward the surface of the bending portion of the cover glass 102. When the swing begins, the first air blow gun 108 blows the air from a connect portion of the bending portion and the main body portion of the cover glass 102 to the bending portion of the cover glass 102, and then terminates at an end of the bending portion of the cover glass 102.

The second rotating mechanism operates at the same time as the first rotating mechanism, so as to attach an opposite end of the flexible display layer 106 and another bending portion of the cover glass 102. Therefore, the whole of the attachment of the cover glass 102 is finished.

Because the structure of the second rotating mechanism is the same as the first rotating mechanism, please refer to the above-mentioned specific operating principle of the first rotating mechanism, which is not described here.

For further fixing the two ends of the flexible film substrate 105, a pressing mechanism is disposed outside of the sucking-attachment assembly. The pressing mechanism includes a first pressing clamp assembly 110 and a second pressing clamp assembly 111, wherein the first pressing clamp assembly 110 is disposed outside of the first sucking-attachment platform 103, and the second pressing clamp assembly 111 is disposed outside of the second sucking-attachment platform 104.

The first pressing clamp assembly 110 has a first supporting portion, wherein a first moving track is movably connected to a bottom of the first supporting portion; a first vertical track is disposed at one end of the first supporting portion; and the first pressing clamp is movably connected to the first vertical track.

The second pressing clamp assembly 111 has a second supporting portion, wherein a second moving track is movably connected to a bottom of the second supporting portion; a second vertical track is disposed at one end of the second supporting portion; and the second pressing clamp is movably connected to the second vertical track.

When the two ends of the flexible film substrate 105 are attached on the first sucking-attachment platform 103 and the second sucking-attachment platform 104, the first pressing clamp assembly 110 is close to the first sucking-attachment platform 103, and the second pressing clamp assembly 111 is close to the second sucking-attachment platform 104, so that the first pressing clamp presses on one end of the flexible film substrate 105, and the second pressing clamp presses on an opposite end of the flexible film substrate 105, so as to assist the sucking-attachment assembly in fixing the flexible film substrate 105.

Figure 2A:
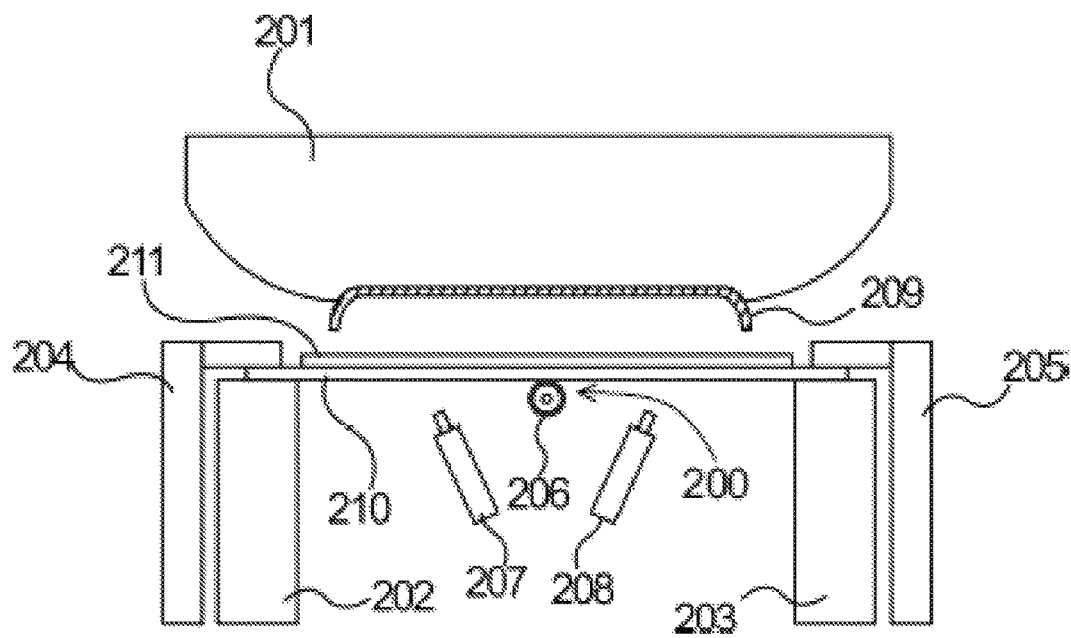
FIGS. 2a-2c are schematic views showing an attaching process of the flexible display panel attaching device according to the present disclosure.

As shown in FIG. 2a, a flexible display panel attaching device of the present disclosure includes a profile modeling fixture 201, a first sucking-attachment platform 202, a second sucking-attachment platform 203, a first pressing clamp assembly 204, a second pressing clamp assembly 205, a roller assembly 200 having at least one roller 206, a first air blow gun 207, and a second air blow gun 208.

At this moment, a cover glass 209 is fixed on the profile modeling fixture 201; a flexible film substrate 210 is sucked and attached onto the first sucking-attachment platform 202 and the second sucking-attachment platform 203; the first pressing clamp assembly 204 and the second pressing clamp assembly 205 press on two ends of the flexible film substrate 210; and a flexible display layer 211 is adhered on a surface of the flexible film substrate 210.

Figure 2B:
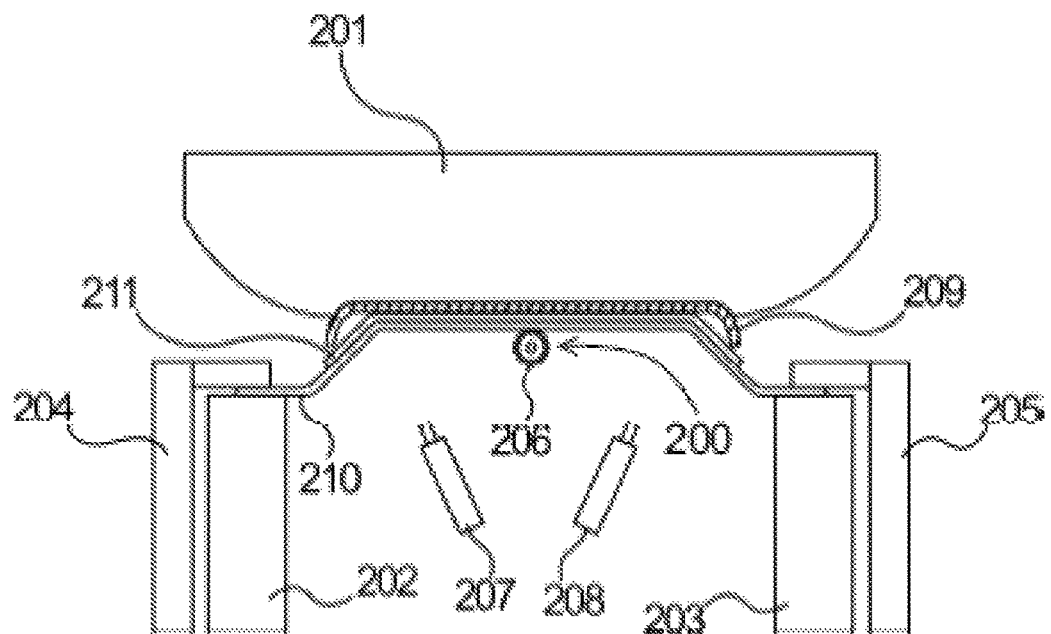

As shown in FIG. 2b, the flexible display panel attaching device of the present disclosure includes the profile modeling fixture 201, the first sucking-attachment platform 202, the second sucking-attachment platform 203, the first pressing clamp assembly 204, the second pressing clamp assembly 205, the roller 206, the first air blow gun 207, and the second air blow gun 208.

At this moment, the roller is moved up, so as to lift the flexible film substrate 210 and the flexible display layer 211 to contact with a surface of the cover glass 209, and then the roller rolls and presses the flexible film substrate 210 and the flexible display layer 211, so that the flexible display layer 211 is attached to a main body portion of the cover glass 209.

Figure 2C:
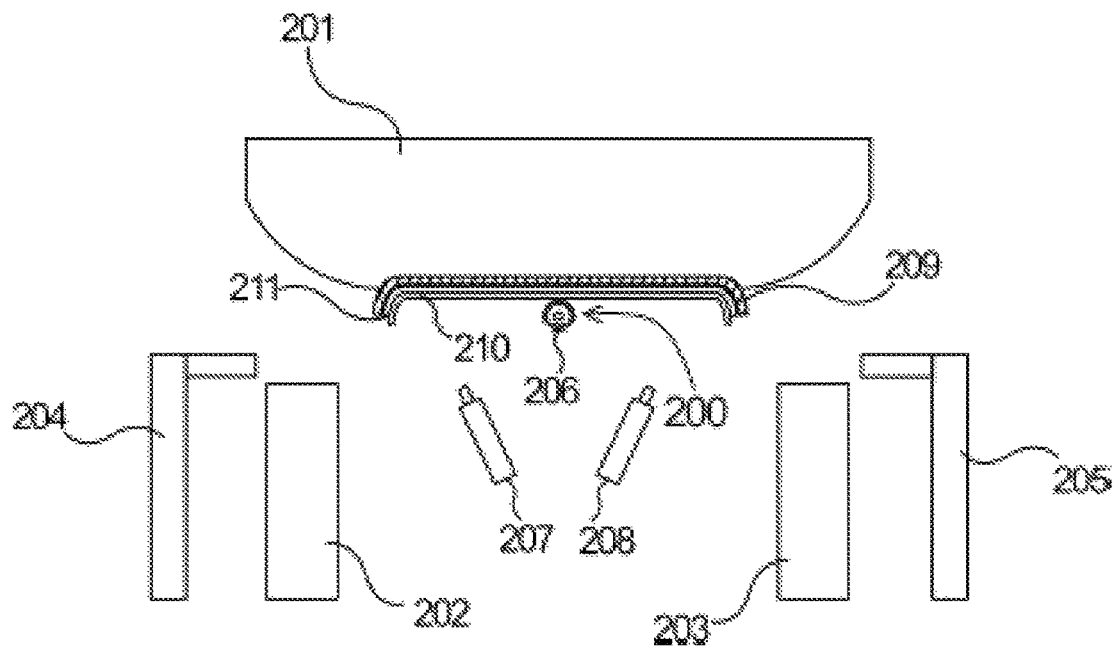

As shown in FIG. 2c, the flexible display panel attaching device of the present disclosure includes the profile modeling fixture 201, the first sucking-attachment platform 202, the second sucking-attachment platform 203, the first pressing clamp assembly 204, the second pressing clamp assembly 205, the roller 206, the first air blow gun 207, and the second air blow gun 208.

At this moment, the profile modeling fixture 201, the first sucking-attachment platform 202, the second sucking-attachment platform 203, the first pressing clamp assembly 204, and the second pressing clamp assembly 205 stop fixing the flexible film substrate 210, and the first air blow gun 207 and the second air blow gun 208 are opened to blow the flexible film substrate 210 forward to two bending portions of the cover glass 209, respectively, so that two edge regions of the flexible display layer 211 are attached to the two bending portions of the cover glass 209.

In the embodiment of the present disclosure, firstly, by using the roll-pressing of the roller 206, a portion of the flexible display layer 211 is attached to the main body portion of the cover glass 209; and then by using the air blow guns, the two regions of the flexible display layer 211 which the roller 206 cannot reach are blown, and the two regions of the flexible display layer 211 are attached to the two bending portions of the cover glass 209, so that the whole of the attachment between the cover glass 209 and the flexible display layer 211 is finished.

Figure 3:
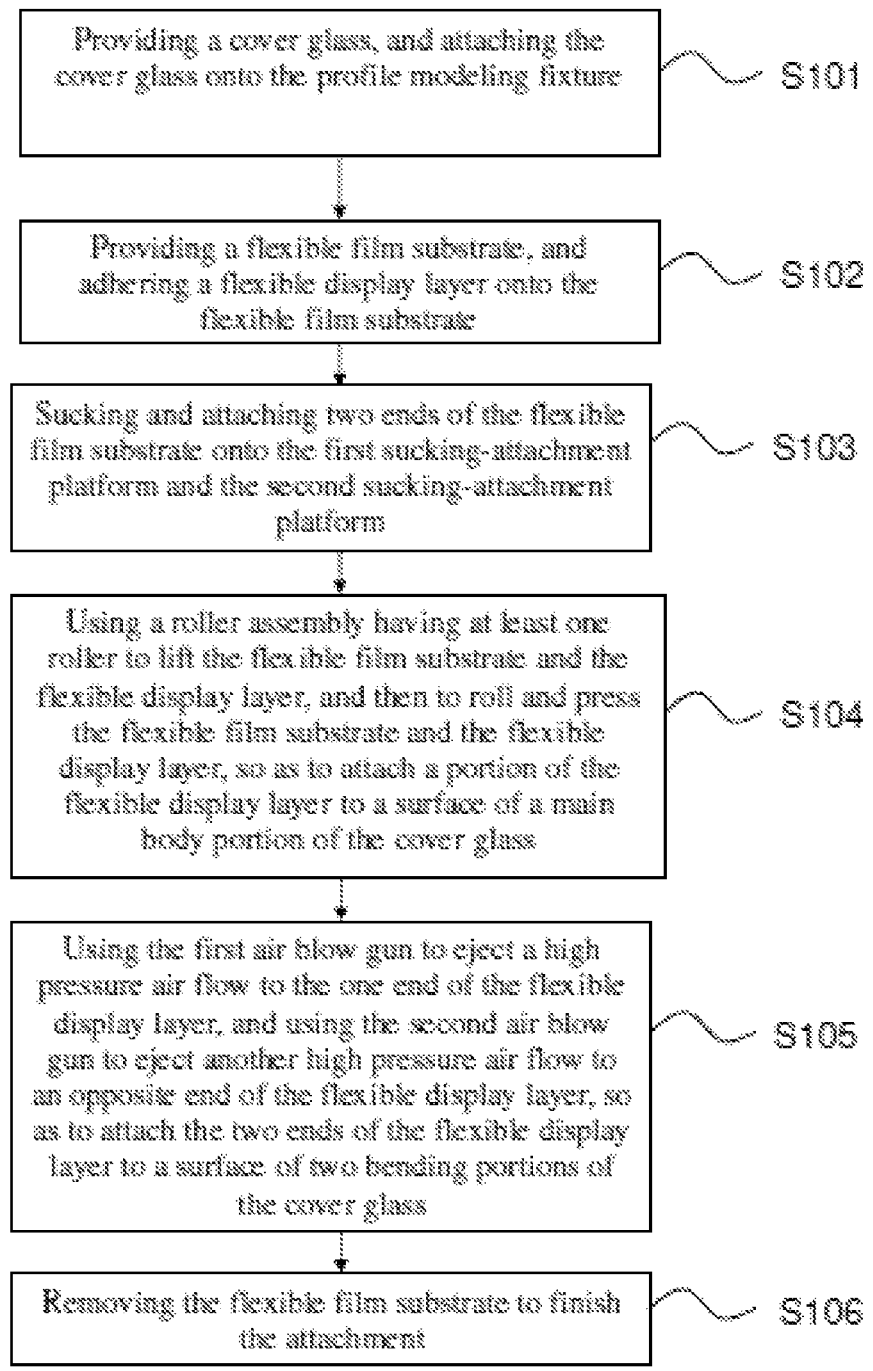
FIG. 3 is a flow chart of an attaching method of the flexible display panel attaching device according to the present disclosure.

FIG. 3 shows an attaching method of a flexible display panel, which uses the above-mentioned flexible display panel attaching device, and includes following steps of:

S101: providing a cover glass, and attaching the cover glass onto the profile modeling fixture.

S102: providing a flexible film substrate, and adhering a flexible display layer onto the flexible film substrate.

S103: sucking and attaching two ends of the flexible film substrate onto the first sucking-attachment platform and the second sucking-attachment platform.

Preferably, by using the first pressing clamp, one end of the flexible film substrate is fixed, and by using the second pressing clamp, an opposite end of the flexible film substrate is fixed.

S104: using a roller assembly having at least one roller to lift the flexible film substrate and the flexible display layer, and rolling and pressing the flexible film substrate and the flexible display layer, so as to attach a portion of the flexible display layer onto a surface of a main body portion of the cover glass.

S105: using the first air blow gun to eject a high pressure air flow to the one end of the flexible display layer, and using the second air blow gun to eject another high pressure air flow to the opposite end of the flexible display layer, so as to attach two ends of the flexible display layer to a surface of two bending portions of the cover glass.

Preferably, the first air blow gun is rotated back and forth to eject a high pressure air flow to the one end of the flexible display layer, and the second air blow gun is rotated back and forth to eject another high pressure air flow to the opposite end of the flexible display layer.

S106: removing the flexible film substrate to finish the attachment.

The advantageous effects of the present disclosure are: by the flexible display panel attaching device of the present disclosure, a flexible OLED display layer can be attached to a surface of the cover glass with a greater radian and smaller fillets, so as to increase the quality of the attachment of the flexible OLED display layer.

The present disclosure has been described with preferred embodiments thereof and it is understood that many changes and modifications to the described embodiment can be carried out without departing from the scope and the spirit of the invention that is intended to be limited only by the appended claims.

What is claimed is:

1. A flexible display panel attaching device, comprising: a profile modeling fixture configured to clamp a cover glass, wherein the cover glass includes a main body portion and two bending portions disposed on two ends of the main body portion; a sucking-attachment assembly located directly under the profile modeling fixture and configured to suck and attach a flexible film substrate, wherein a flexible display layer is adhered on a surface of the flexible film substrate, the sucking-attachment assembly includes a first sucking-attachment platform and a second sucking-attachment platform disposed symmetrically to each other; a distance is defined between the first sucking-attachment platform and the second sucking-attachment platform; one end of the flexible film substrate is sucked onto the first sucking-attachment platform, and an opposite end of the flexible film substrate is sucked onto the second sucking-attachment platform; and a width of the flexible film substrate is greater than that of the flexible display layer, so that two regions of the flexible film substrate exceeding the flexible display layer are formed as two sucking-attachment regions; a roller assembly having at least one roller connected to a horizontal moving device and a vertical moving device, wherein the at least one roller is located between the first sucking-attachment platform and the second sucking-attachment platform, and under the flexible film substrate; the at least one roller is configured to lift the flexible film substrate and the flexible display layer, and then to roll and press the flexible film substrate and the flexible display layer, so as to attach a portion of the flexible display layer to a surface of the main body portion of the cover glass; and an air blow gun assembly located between the first sucking-attachment platform and the second sucking-attachment platform, and under the flexible film substrate, wherein the air blow gun assembly includes a first air blow gun and a second air blow gun disposed symmetrically to each other; and the first air blow gun and the second air blow gun are configured to eject two high pressure air flows to two ends of the flexible display layer, so as to attach the two ends of the flexible display layer to a surface of the two bending portions of the cover glass.

2. The flexible display panel attaching device according to claim 1, wherein a pressing mechanism is disposed outside of the sucking-attachment assembly, and includes a first pressing clamp assembly and a second pressing clamp assembly; the first pressing clamp assembly is disposed outside of the first sucking-attachment platform; and the second pressing clamp assembly is disposed outside of the second sucking-attachment platform.

3. The flexible display panel attaching device according to claim 2, wherein the first pressing clamp assembly has a supporting portion, and a moving track is movably connected to a bottom of the supporting portion; a vertical track is disposed at one end of the supporting portion; and a pressing clamp is movably connected to the vertical track.

4. The flexible display panel attaching device according to claim 1, wherein the air blow gun assembly further includes a first rotating mechanism and a second rotating mechanism; and the first rotating mechanism corresponds with and connects to the first air blow gun, and the second rotating mechanism corresponds with and connects to the second air blow gun.

5. The flexible display panel attaching device according to claim 4, wherein the first rotating mechanism has a base, and two ends of the base are provided with two supporting boards; the first air blow gun is pivotally connected between the two supporting boards by a shaft; and one end of the shaft is connected to a servomotor.

6. The flexible display panel attaching device according to claim 1, wherein the flexible display panel attaching device is disposed in a vacuum chamber.

7. A flexible display panel attaching device, comprising: a profile modeling fixture configured to clamp a cover glass, wherein the cover glass includes a main body portion and two bending portions disposed on two ends of the main body portion; a sucking-attachment assembly located directly under the profile modeling fixture and configured to suck and attach a flexible film substrate, wherein a flexible display layer is adhered on a surface of the flexible film substrate, the sucking-attachment assembly includes a first sucking-attachment platform and a second sucking-attachment platform disposed symmetrically to each other; a distance is defined between the first sucking-attachment platform and the second sucking-attachment platform; and one end of the flexible film substrate is sucked onto the first sucking-attachment platform, and an opposite end of the flexible film substrate is sucked onto the second sucking-attachment platform; a roller assembly having at least one roller connected to a horizontal moving device and a vertical moving device, wherein the at least one roller is located between the first sucking-attachment platform and the second sucking-attachment platform, and under the flexible film substrate; the at least one roller is configured to lift the flexible film substrate and the flexible display layer, and then to roll and press the flexible film substrate and the flexible display layer, so as to attach a portion of the flexible display layer to a surface of the main body portion of the cover glass; and an air blow gun assembly located between the first sucking-attachment platform and the second sucking-attachment platform, and under the flexible film substrate, wherein the air blow gun assembly includes a first air blow gun and a second air blow gun disposed symmetrically to each other; and the first air blow gun and the second air blow gun are configured to eject two high pressure air flows to two ends of the flexible display layer, so as to attach the two ends of the flexible display layer to a surface of the two bending portions of the cover glass.

8. The flexible display panel attaching device according to claim 7, wherein a pressing mechanism is disposed outside of the sucking-attachment assembly, and includes a first pressing clamp assembly and a second pressing clamp assembly; the first pressing clamp assembly is disposed outside of the first sucking-attachment platform; and the second pressing clamp assembly is disposed outside of the second sucking-attachment platform.

9. The flexible display panel attaching device according to claim 8, wherein the first pressing clamp assembly has a supporting portion, and a moving track is movably connected to a bottom of the supporting portion; a vertical track is disposed at one end of the supporting portion; and a pressing clamp is movably connected to the vertical track.

10. The flexible display panel attaching device according to claim 7, wherein the air blow gun assembly further includes a first rotating mechanism and a second rotating mechanism; and the first rotating mechanism corresponds with and connects to the first air blow gun, and the second rotating mechanism corresponds with and connects to the second air blow gun.

11. The flexible display panel attaching device according to claim 10, wherein the first rotating mechanism has a base, and two ends of the base are provided with two supporting boards; the first air blow gun is pivotally connected between the two supporting boards by a shaft; and one end of the shaft is connected to a servomotor.

12. The flexible display panel attaching device according to claim 7, wherein the flexible display panel attaching device is disposed in a vacuum chamber.

13. An attaching method of a flexible display panel, using the flexible display panel attaching device according to claim 7, comprising steps of:
providing a cover glass, and attaching the cover glass onto the profile modeling fixture;
providing a flexible film substrate, and adhering a flexible display layer onto the flexible film substrate;

sucking and attaching two ends of the flexible film substrate onto the first sucking-attachment platform and the second sucking-attachment platform;

using a roller assembly having at least one roller to lift the flexible film substrate and the flexible display layer, and then to roll and press the flexible film substrate and the flexible display layer, so as to attach a portion of the flexible display layer to a surface of a main body portion of the cover glass;

using the first air blow gun to eject a high pressure air flow to the one end of the flexible display layer, and using the second air blow gun to eject another high pressure air flow to an opposite end of the flexible display layer, so as to attach the two ends of the flexible display layer to a surface of two bending portions of the cover glass; and removing the flexible film substrate to finish the attachment.

14. The attaching method according to claim 13, wherein after the step of sucking and attaching the two ends of the flexible film substrate onto the first sucking-attachment platform and the second sucking-attachment platform, the attaching method further includes steps of: fixing one end of the flexible film substrate by using a first pressing clamp, and fixing an opposite end of the flexible film substrate by using a second pressing clamp.

15. The attaching method according to claim 13, wherein in the step of using the first air blow gun to eject the high pressure air flow to the one end of the flexible display layer, and using the second air blow gun to eject the another high pressure air flow to the opposite end of the flexible display layer, the attaching method further includes steps of: rotating the first air blow gun back and forth to eject the high pressure air flow to the one end of the flexible display layer, and rotating the second air blow gun back and forth to eject the another high pressure air flow to the opposite end of the flexible display layer.

* * * * *